(12) United States Patent
Takagi (10) Patent No.: US 6,876,045 B2
(45) Date of Patent: Apr. 5, 2005

(54) SEMICONDUCTOR DEVICE AND PROCESS FOR MANUFACTURING THE SAME

(75) Inventor: Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/626,642

(22) Filed: Jul. 25, 2003

(65) Prior Publication Data

US 2004/0124479 A1 Jul. 1, 2004

Related U.S. Application Data

(63) Continuation of application No. PCT/JP03/04814, filed on Apr. 16, 2003.

(30) Foreign Application Priority Data

Apr. 17, 2002 (JP) .................................... 2002-115037

(51) Int. Cl.[7] .............................................. H01L 29/72
(52) U.S. Cl. ....................... 257/408; 257/387; 257/412; 257/413; 257/616; 257/755; 257/756; 438/151; 438/157; 438/182; 438/279; 438/283
(58) Field of Search ................................. 257/387, 408, 257/412, 413, 616, 755, 756; 438/151, 157, 182, 279, 283

(56) References Cited

U.S. PATENT DOCUMENTS

| 5,512,771 A | 4/1996 | Hiroki et al. | |
| 6,624,483 B2 * | 9/2003 | Kurata | ........................ 257/387 |
| 2002/0005581 A1 | 1/2002 | Kurata | |

FOREIGN PATENT DOCUMENTS

| JP | 62-045071 | 2/1987 |
| JP | 3-69166 | 3/1991 |
| JP | 6-267972 | 9/1994 |
| JP | 9-45903 | 2/1997 |
| JP | 9-148564 | 6/1997 |
| JP | P2001-119026 A | 4/2001 |
| JP | P2002-100768 A | 4/2002 |

OTHER PUBLICATIONS

Wen–Chin Lee, et al., "Investigation of Poly–$Si_{1-x}Ge_x$ for Dual–Gate CMOS Technology", IEEE Electron Device Letters, vol. 19, No. 7, Jul. 1998.
T. Ghani, et al., "100nm Gate Length High Performance/Low Power CMOS Transistor Structure", 1999 IEEE pp. 415–418.
T. Skotnicki, et al., "Well–Controlled, Selectively Under–Etched Si/SiGe Gates for RF and High Performance CMOS", 2000 IEEE.

* cited by examiner

Primary Examiner—Edward Wojciechowicz
(74) Attorney, Agent, or Firm—McDermott Will & Emery LLP (57) ABSTRACT

This specification relates to a process for manufacturing a semiconductor device, comprising the steps of: forming a lower gate electrode film on a semiconductor substrate 10 via a gate insulating film 11; forming an upper gate electrode film on the lower gate electrode film, the upper gate electrode film being made of a material having a lower oxidation rate than that of the lower gate electrode film; forming a gate electrode 12 by patterning the upper gate electrode film and the lower gate electrode film, the gate electrode 12 comprising a lower gate electrode element 12a and an upper gate electrode element 12b; forming source/drain regions 15 by introducing an impurity into the semiconductor substrate 10; and forming oxide film sidewalls 13 by oxidizing the side faces of the lower gate electrode element 12a and the upper gate electrode element 12b, the thickness of the oxide film sidewalls 13 in the gate length direction being larger at the sides of the lower gate electrode element 12a than at the sides of the upper gate electrode element 12b.

7 Claims, 11 Drawing Sheets

Fig. 11

SEMICONDUCTOR DEVICE AND PROCESS FOR MANUFACTURING THE SAME

This application is a continuation of International Application Serial No. PCT/JP03/04814 filed Apr. 16, 2003, which claims priority of Japanese Application Serial No. 2002-115037, filed on Apr. 17, 2002, in Japan.

TECHNICAL FIELD

The present invention relates to a semiconductor device having an MIS transistor structure, and a process for manufacturing the same.

BACKGROUND ART

In recent years, the scaling of CMOS devices, such as the reduction of the gate length in MIS transistors or the thinning of gate insulating films, has allowed for improvements in operating speed and integration. In particular, MIS transistors having a gate insulating film with a thickness of 2 nm or less or a gate electrode with a gate length of about 50 nm have recently been developed.

Figure 11:
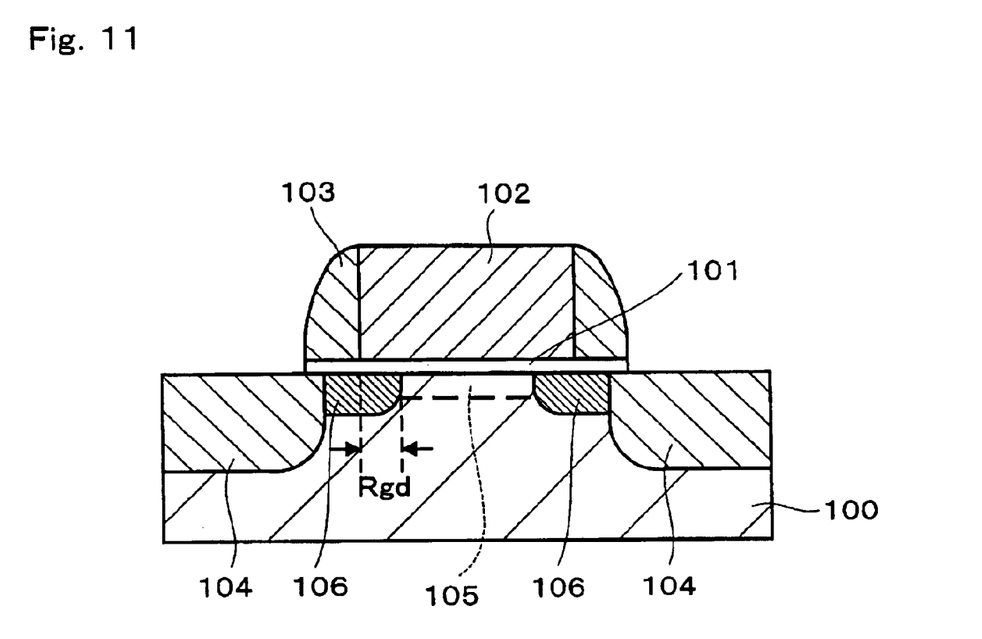
FIG. 11 is a cross-sectional view of a conventional MIS transistor.

FIG. 11 is a cross-sectional view of a conventional MIS transistor. As shown in the figure, this MIS transistor comprises an Si substrate 100 and a gate electrode 102 formed thereon via a gate insulating film 101 composed of silicon oxide. The gate electrode 102 is composed of polysilicon, and has oxide film sidewalls 103 formed on its side faces. The Si substrate 100 includes high-impurity-concentration source/drain regions 104 formed at the sides of the oxide sidewalls 103, and source/drain extension regions 106 formed in such a manner as to extend from the inner edges of the source/drain regions 104 toward the area under the gate electrode 102 and to sandwich a channel region 105.

According to the above MIS transistor, thinning the gate insulating film 101 allows for low-voltage operation and increases the current drive capability, however, it causes the following problems because the gate electrode 102 is composed of polysilicon.

(1) The impurity introduced into the gate electrode 102, such as boron, may penetrate the extremely thin oxide film 101 and may therefore enter the channel region 105, leading to deterioration in the electrical characteristics of the MIS transistor, such as fluctuations in threshold voltage.

(2) Thinning the gate insulating film 101 increases the capacitance of the film, causing a depletion layer to also be formed in the gate electrode 102 and increasing the substantial thickness of the gate insulating film 101. This problem is also attributed to the fact that there is a solid solubility limit for the impurity contained in the gate electrode 102, which is composed of polysilicon.

(3) There is an increase in the gate overlap capacitance, which is originated in the region Rgd where the source/drain extension region 106 and the gate electrode 102 overlap, as shown in FIG. 11. More specifically, as a result of thinning the gate insulating film 101 and reducing the gate length, the parasitic capacitance is increased by an amount that cannot be neglected. Such a significant increase in gate overlap capacitance is a factor that inhibits improvement in the operating speed of MIS transistors.

At present, the following suggestions have been proposed as solutions to the above problems.

(1) To prevent the penetration of boron, it has been suggested that an oxynitride film be used as a gate insulating film, due to its effectiveness in preventing impurity diffusion.

(2) As a measure for avoiding the depletion of the gate electrode, Publication No. 1 (W. C. Lee et al., "Investigation of Poly-Sil-xGex for Dual-Gate CMOS Technology", IEEE Electron Device Lett., Vol. 19, 1998, p. 247), for example, suggests a CMOS device whose gate electrode contains polycrystalline SiGe, which allows for a high solid solubility for the impurity.

(3) As an approach to prevent the increase in gate overlap capacitance, Publication No. 2 (T. Ghani, et al., "100 nm Gate Length High Performance/Low Power CMOS Transistor Structure", 1999 IEDM, p. 415), for example, suggests a notched-gate structure, in which the lower part of the polysilicon gate electrode is narrowed. In the notched-gate structure, the width of the upper part of the gate electrode is large, whereas the width of the lower part, which stipulates the transistor gate length, is small. This structure counteracts the possible increase in gate resistance caused by the reduction in gate length, thus reducing the increase in gate overlap capacitance.

The notched-gate structure is also described in, for example, Publication No. 3 (Japanese Unexamined Patent Publication No. 1987-45071). Publication No. 3 discloses a gate electrode which is composed of a polycrystalline silicon layer and a high-melting point metal silicide layer formed thereon. This gate electrode is heat-treated so that a thermally oxidized silicon film is grown on the side face of the gate electrode such that the thickness thereof is larger on the silicide layer, which is formed on top, than on the polycrystalline silicon layer, thus ultimately forming a notched-gate structure.

Further, Publication No. 4 (T. Skotnicki, et al., "Well-controlled, selectively under-etched Si/SiGe gates for RF and high performance CMOS", 2000 Symposium on VLST Technology, p. 156) reports a transistor in which the teachings of Publication Nos. 1 and 2 are combined, namely, in which a notched-gate structure is established by forming a gate electrode having a stacked structure composed of polycrystalline SiGe and polycrystalline Si and further by selectively dry-etching only the lower part of the gate electrode, which is composed of polycrystalline SiGe.

A notched-gate structure such as that disclosed in the above Publication No. 4 is relatively simple, yet effective in reducing the gate overlap capacitance, and is in this respect considered to be a promising approach.

However, the notched gate cited in Publication No. 4, while being simple in structure, requires a special dry etching technique by which only the lower part of the gate electrode, which is composed of polycrystalline SiGe, can be selectively etched in the lateral direction, and thus entails a complicated manufacturing process.

In addition, Japanese Unexamined Patent Publication No. 1994-196495 (U.S. Pat. No. 5,512,771) teaches, in FIG. 2 and its description, giving the gate electrode a convex shape in sectional view to thereby reduce the gate-to-drain overlap capacitance.

An object of the present invention is to provide a semiconductor device with an MIS transistor structure and a process for manufacturing the same in which a notched-gate structure is formed by selectively narrowing the lower gate electrode element using a simple process.

DISCLOSURE OF THE INVENTION

A process for manufacturing a semiconductor device according to the first invention for solving the above problems comprises the steps of: forming a lower gate electrode film on a semiconductor substrate via a gate insulating film;

forming an upper gate electrode film on the lower gate electrode film, the upper gate electrode film being made of a material having a lower oxidation rate than that of the lower gate electrode film; forming a gate electrode by patterning the upper gate electrode film and the lower gate electrode film, the gate electrode comprising a lower gate electrode element and an upper gate electrode element; forming source/drain regions by introducing an impurity into the semiconductor substrate; and forming oxide film sidewalls by oxidizing the side faces of the lower gate electrode element and the upper gate electrode element, the thickness of the oxide film sidewalls in the gate length direction being larger at the sides of the lower gate electrode element than at the sides of the upper gate electrode element.

A semiconductor device according to the second invention for solving the above problems comprises a semiconductor substrate, a lower gate electrode element formed on the semiconductor substrate via a gate insulating film, an upper gate electrode element formed on the lower gate electrode element and made of a material having a lower oxidation rate than that of the lower gate electrode element, source/drain regions formed in the semiconductor substrate below the lower gate electrode element in such a manner as to sandwich a channel region, and oxide film sidewalls formed by oxidizing the side faces of the lower gate electrode element and the upper gate electrode element, the thickness of the oxide film sidewalls in the gate length direction being larger at the sides of the lower gate electrode element than at the sides of the upper gate electrode element.

BRIEF DESCRIPTION OF THE DRAWINGS

FIGS. 6(a), (b) and (c) are energy band diagrams showing the band structure for n-type and p-type polycrystalline Si gates, n-type and p-type polycrystalline SiGe gates, and n-type and p-type polycrystalline SiGeC gates, respectively.

FIGS. 7(a) and (b) are diagrams showing the built-in potential of a pMISFET having a polycrystalline Si gate and an Si channel region, and of a pMISFET having a polycrystalline SiGe gate and an Si channel region, respectively.

FIGS. 8(a) and (b) are diagrams showing the built-in potential of a pMISFET having a polycrystalline SiGe gate and an SiGe channel region, and of a pMISFET having a polycrystalline SiGe gate and an SiGeC channel region, respectively.

BEST MODE FOR CARRYING OUT THE INVENTION (First Embodiment)

Figure 1:
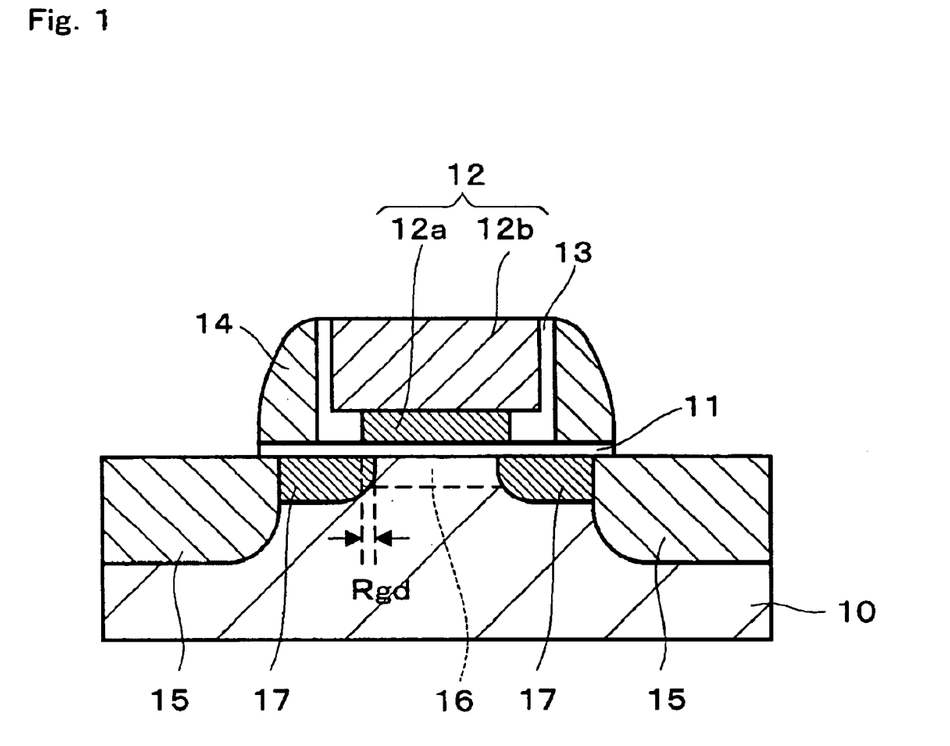
FIG. 1 is a cross-sectional view of a semiconductor device according to the first embodiment of the present invention.

The first embodiment of the present invention will be described below. FIG. 1 is a cross-sectional view of a semiconductor device of the present embodiment.

As illustrated in the figure, this semiconductor device is an MIS transistor, and comprises an Si substrate 10 and a gate electrode 12 formed on the substrate 10 via a gate insulating film 11. The gate insulating film 11 is composed of silicon oxide, and has a thickness of about 2 nm. The gate electrode 12 is composed of a lower gate electrode element 12a formed on the gate insulating film 11 and an upper gate electrode element 12b formed thereon. The lower gate electrode element 12a includes a p-type impurity (e.g., boron) in high concentration, and is composed of polycrystalline SiGe (with a Ge composition ratio of about 50%) with a thickness of about 50 nm. The upper gate electrode element 12b includes a p-type impurity (e.g., boron) in high concentration, and is composed of polycrystalline Si with a thickness of about 150 nm.

Oxide film sidewalls 13 are formed on the side faces of the gate electrode 12, i.e., on the side faces of the upper gate electrode element 12b and the lower gate electrode element 12a. Nitride film sidewalls 14 are also formed on the side faces of the oxide film sidewalls 13. Further, high-impurity-concentration p-type source/drain regions 15 are formed in the Si substrate 10 at the sides of the nitride film sidewalls 14. Source/drain extension regions 17 are also formed in the substrate 10 in such a manner as to extend from the inner edges of the source/drain regions 15 toward the area under the lower gate electrode element 12a and to sandwich a channel region 16.

As presented in FIG. 1, the length of the lower gate electrode element 12a in the gate length direction is shorter than the length of the upper gate electrode element 12b in the gate length direction. Such a structure is achieved by the following manufacturing process.

The process for manufacturing the above semiconductor device will be described below with reference to FIGS. 2 and 3. This semiconductor device, being a p-type MIS transistor, is assumed to be fabricated on an n-well. In addition, FIGS. 2 and 3 illustrate only the active regions surrounded by a device isolation region.

Figure 2:
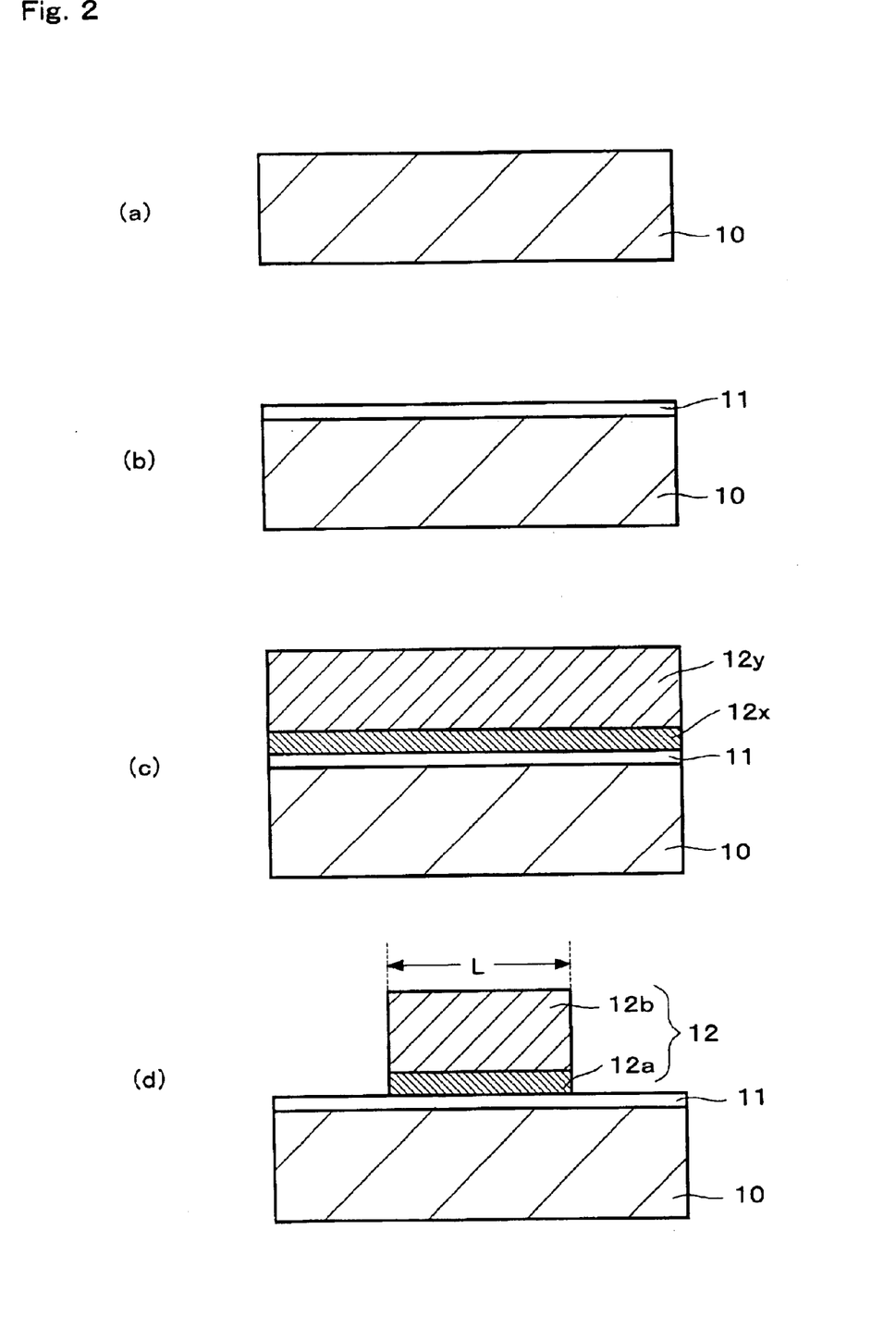
FIG. 2 illustrates the process for manufacturing the semiconductor device of FIG. 1.

To start with, the device isolation region (omitted from the drawing), the well, etc., are formed on the substrate 10, as shown in FIG. 2(a). Then, the top face of the Si substrate 10 is oxidized by means of thermal oxidation, thereby forming the gate insulating film 11 with a thickness of about 2 nm, as shown in FIG. 2(b). Thereafter, by using an LP-CVD method, a polycrystalline SiGe film (lower gate electrode film) 12x with a thickness of about 50 nm and a polycrystalline Si film (upper gate electrode film) 12y with a thickness of about 150 nm are stacked in this order on the gate insulating film 11, as shown in FIG. 2(c). Subsequently, as shown in FIG. 2(d), the polycrystalline SiGe film 12x and the polycrystalline Si film 12y thus stacked are patterned by means of photolithography and dry etching, thereby forming the upper gate electrode element 12b and the lower gate electrode element 12a, both having a length of about 0.13

μm in the gate length direction. At this point, the upper gate electrode element 12b and the lower gate electrode element 12a have the same gate length L, as is apparent from FIG. 2(d).

Figure 3:
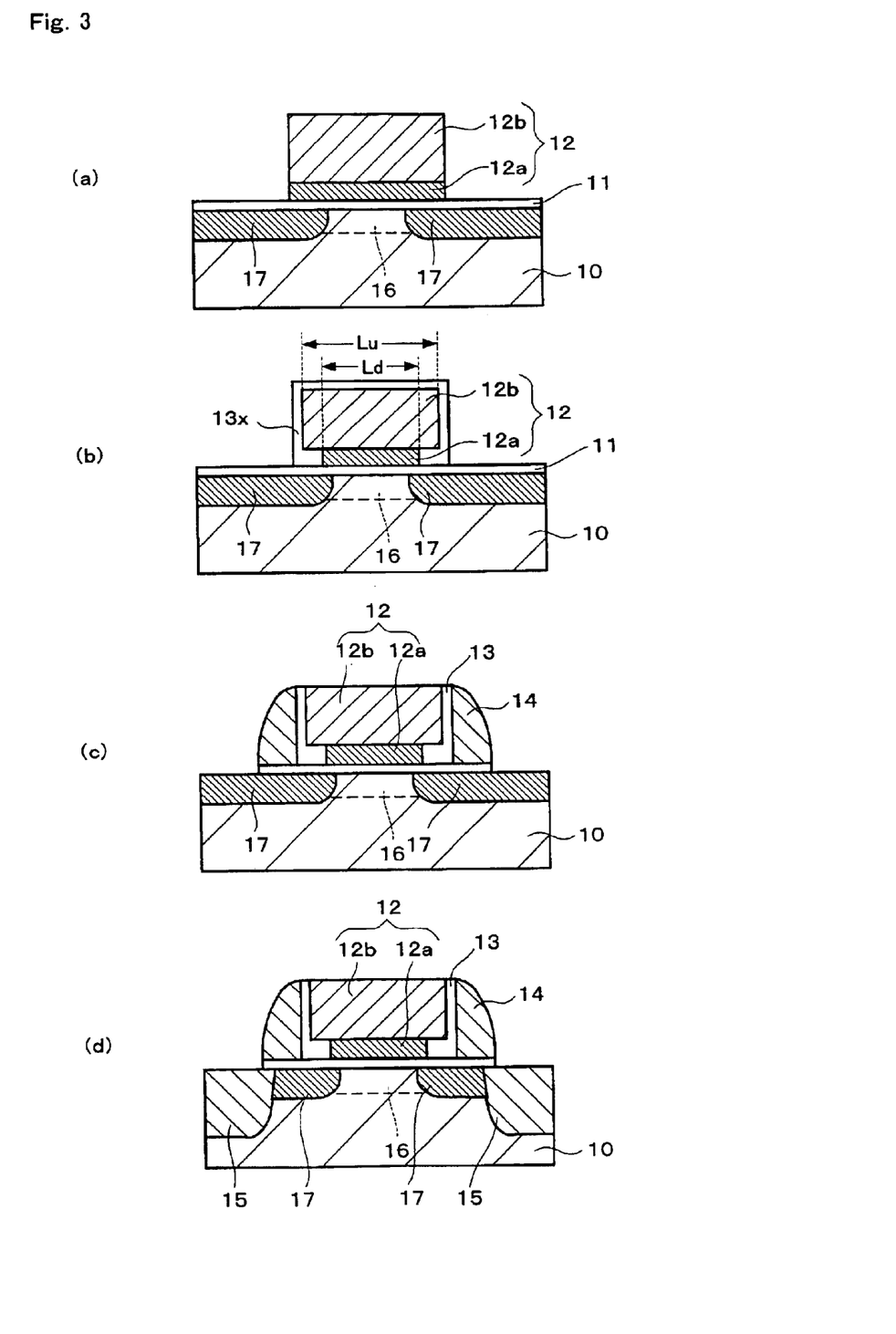
FIG. 3 illustrates the process for manufacturing the semiconductor device of FIG. 1.

Thereafter, boron fluoride ions ($BF_2+$) are implanted as p-type impurity ions from above the gate electrode 12 under the conditions of 5-keV acceleration voltage, a dose amount of $1 \times 10^{15}$ cm$^{-2}$, and 7 degrees or less inclination, thereby forming the source/drain extension regions 17, as shown in FIG. 3(a).

Subsequently, pyrogenic oxidation is performed to form an oxide film 13x, which covers the side faces of the lower gate electrode element 12a and the top and side faces of the upper gate electrode element 12b. The progression of the oxidation is faster at the lower gate electrode element 12a than at the upper gate electrode element 12b, because the oxidation rate of polycrystalline SiGe is about 2 to 4 times higher than that of polycrystalline Si. Accordingly, after the completion of the pyrogenic oxidation, the thickness of the oxide film 13x in the gate length direction becomes about 30 nm at each of the side faces of the lower gate electrode element 12a, while it becomes about 10 nm at the top and each of the side faces of the upper gate electrode element 12b.

As is obvious by FIG. 3(b), the gate length of each of the upper gate electrode element 12b and lower gate electrode element 12a is shortened by the oxidation described above, ultimately giving the gate length expressed by Lu and Ld, respectively. The gate length Ld of the lower gate electrode element 12a is shorter than the gate length Lu of the upper gate electrode element 12b, meaning that the overall shape of the gate electrode 12 is convex in the downward direction.

Thereafter, a silicon nitride film is deposited on the substrate, and is then anisotropically etched, thereby etching away the oxide film 13x so as to leave only the oxide film sidewalls 13 on the side faces of the gate electrode elements 12a and 12b, and at the same time forming the nitride film sidewalls 14 on the side faces of the oxide film sidewalls 13. As a result, the gate electrode 12 having a convex shape in the downward direction is sandwiched between the pair of oxide film sidewalls 13, one of the pair being shaped like the letter "L", and the other one being shaped like a backward letter "L".

Next, boron fluoride ions ($BF_2+$) are implanted as p-type impurity ions from above the gate electrode 12 and the sidewalls 13 and 14 under the conditions of 30-keV acceleration voltage, a dose amount of $4 \times 10^{15}$ cm$^{-2}$, and 7 degrees or less inclination, thereby forming the high-impurity-concentration source/drain regions 15, as illustrated in FIG. 3(d). Following this, RTA (rapid thermal annealing) is performed to thereby activate the impurities contained in the high-impurity-concentration source/drain regions 15 and the source/drain extension regions 17.

The process that follows thereafter is omitted from the drawings, but includes, for example, forming interlayer insulating films on the substrate, forming contact holes, and providing plugs and wiring.

As previously described, the semiconductor device manufacturing process of the present embodiment configures the gate electrode 12 from the lower gate electrode element 12a, which is composed of polycrystalline SiGe, and the upper gate electrode element 12b, which is composed of polycrystalline Si, and oxidizes the gate electrode 12. Since the oxidation rate of polycrystalline SiGe is higher than that of polycrystalline Si, the oxidation proceeds faster at the lower gate electrode element 12a, which is composed of polycrystalline SiGe, than at the upper gate electrode element 12b, with the result that the length of the lower gate electrode element 12a in the gate length direction becomes shorter than the length of the upper gate electrode element 12b in the gate length direction.

Therefore, a notched-gate structure can be established with a remarkably simple process, without requiring a special dry etching technique for selectively etching only the lower gate electrode element, i.e., a conventional technique such as that of Publication No. 3, which was cited earlier.

Since the oxidation of the gate electrode 12 is performed after forming the source/drain extensions 17 by implanting impurity ions from above the gate electrode 12, the area of the overlap region Rgd between the source/drain extension region 17 and the gate electrode 12 is reduced in total by the amount of the reduction in the length of the lower gate electrode element 12a in the gate length direction. This prevents the gate overlap capacitance from increasing even when the gate insulating film 11 is thinned. The reduction in parasitic capacitance as thus achieved will translate into higher-speed operation. Furthermore, since the reduction in the length of the upper gate electrode element 12b in the gate length direction is not as large as the reduction in the length of the lower gate electrode element 12a in the gate length direction, an increase in gate resistance is prevented, thus ensuring the drive capability of the MIS transistor.

Figure 4:
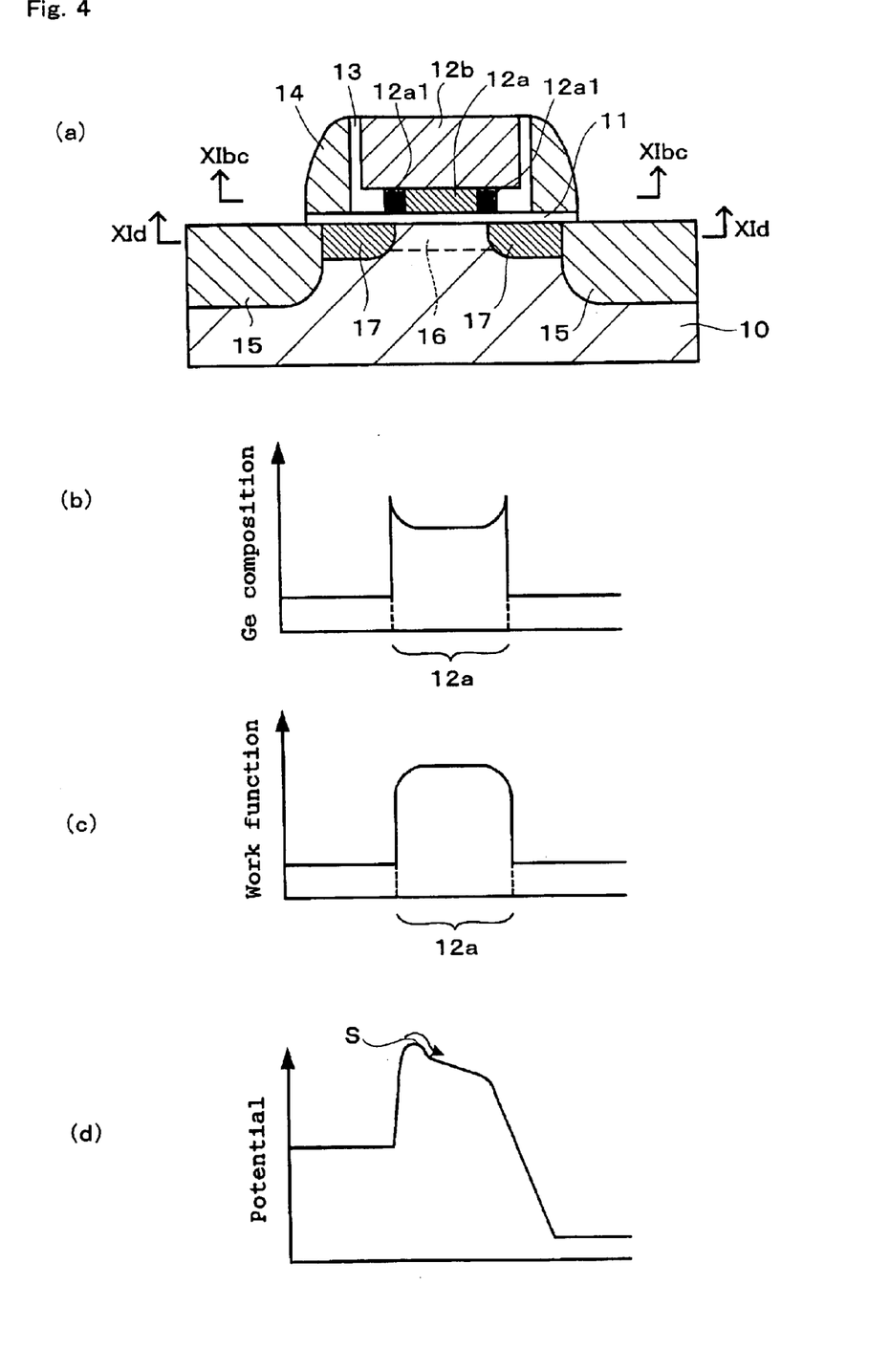
FIGS. 4(a) to (d) are a cross-sectional view of the semiconductor device of FIG. 1, a diagram showing the distribution of the Ge composition ratio taken at the cross-section of line IVbc—IVbc, a diagram showing the distribution of the work function taken at the cross-section of line IVbc—IVbc, and a diagram showing the potential at the valence band edge taken at the cross-section of line IVbc—IVbc, respectively.

The semiconductor device according to the present embodiment has, in particular, the following advantages because of its lower gate electrode element being composed of polycrystalline SiGe. The advantages will be described by referring to FIG. 4.

FIGS. 4(a) to (d) are a cross-sectional view of the semiconductor device of FIG. 1, a diagram showing the distribution of the Ge composition ratio taken at the cross-section of line IVbc—IVbc, a diagram showing the distribution of the work function taken at the cross-section of line IVbc—IVbc, and a diagram showing the potential at the valence band edge taken at the cross-section of line IVbc—IVbc, respectively. In FIG. 4(d), the vacuum level appears at the lower part of the vertical axis.

An $SiO_2$ film is formed as an oxide film in the oxidation of the SiGe layer. In this process, a phenomenon is observed in which Ge is released from already-oxidized regions into not-yet-oxidized regions. The released Ge is concentrated in a region 12a1, which appears inside the SiGe layer in the vicinity of the interface between the layer and the oxide film. Accordingly, the Ge concentration in the region 12a1, which is located in the vicinity of the interface between the SiGe layer and the oxide film, becomes higher than that in the area other than the region 12a1 in the lower gate electrode element 12a, thus causing the regions of the lower gate electrode element 12a that are located adjacent to the oxide film sidewalls 13 to be Ge-rich, as shown in FIG. 4(b). Consequently, as indicated in FIG. 4(c), the work function in the regions of the lower gate electrode element 12a that are located adjacent to the oxide film sidewalls 13 becomes lower than that in the central region of the gate, with the result that the potential with respect to hole mobility in the channel region 16 becomes higher in the edge portions than in the central portion.

As a result, when a drain voltage is applied to a p-channel MIS transistor according to the present embodiment, a region S, which corresponds to the region 12a1, located in the vicinity of the SiGe layer/oxide film interface, and which represents a gradient of potential for hole mobility, is generated in the channel region 16, as indicated in FIG. 4(d). Due to the graded potential S, the holes are accelerated by the electric field and therefore transit through the p-channel at high velocity, thus enabling high-speed operation.

The same holds true for an n-channel MIS transistor. The lower gate electrode element of an n-channel MIS transistor is generally doped with an n-type impurity. Thus, in contrast to FIG. 4(c), the regions of the lower gate electrode element 12a which are located adjacent to the oxide film sidewalls 13 and which have a higher Ge composition ratio, have a higher work function than that of the central region of the gate, with the result that the potential for electron mobility in the channel region becomes higher in the edge portions than in the central portion. Consequently, when a drain voltage is applied to the n-channel MIS transistor, a region of graded potential for electron mobility is generated in the channel region. Due to the graded potential, the electrons are accelerated by the electric field and therefore transit through the n-channel at high velocity, thus enabling high-speed operation.

While polycrystalline SiGe is used to form the lower gate electrode element 12a in the present embodiment, polycrystalline SiGeC may alternatively be used in which carbon (C) is contained in a very small proportion of 1% or less. This alternative has an advantage in that the C contained therein restricts the diffusion of boron and thus effectively prevents adverse effects, such as fluctuations in threshold voltage, caused by the penetration of boron into the Si substrate 10. The above polycrystalline SiGeC has almost the same oxidation rate as the polycrystalline SiGe because the amount of C contained therein is very small, and thus is considered to be identical to the polycrystalline SiGe in the respect that it enables the simple formation of a notched-gate structure. The polycrystalline SiGeC is identical to the polycrystalline SiGe also in that it enables high-speed operation in semiconductor devices owing to the Ge contained therein, as can be understood from FIG. 4.

In the present embodiment, Group IV semiconductors (comprising at least Si, such as Si, SiGe, or SiGeC) are used to form the lower gate electrode element 12a and the upper gate electrode element 12b. However, the invention is not limited to the above semiconductors, and, from the viewpoint of forming a notched-gate structure by making use of differences in the oxidation rate, any other materials may alternatively be used as long as the oxidation rate of the lower gate electrode element 12a is higher than that of the upper gate electrode element 12b. For example, the upper gate electrode element 12b may be formed by a metal or a silicide, such as one of tungsten, and the lower gate electrode element 12a may be formed by polycrystalline Si. In the case of this example, oxidation mostly occurs only at the lower gate electrode element 12a because the surface of the metal hardly oxidizes at all, with the result that a notched-gate structure is formed. In addition, since the oxidation rate usually increases with an increase in the Ge composition ratio, a notched-gate structure may also be formed by using SiGe for both the upper gate electrode element 12b and the lower gate electrode element 12a, with the Ge composition ratio of the lower gate electrode element 12a being higher than that of the upper gate electrode element 12b.

In the above-explained arrangement, oxidation is used to raise the Ge composition ratio in both side portions of the lower gate electrode element 12a in the gate length direction to be higher than that in the central portion. However, it is also possible to form regions with a higher Ge composition ratio in advance in both side portions of the lower gate electrode element 12a. For example, the lower gate electrode element 12a may be designed such that a polycrystalline Si region is formed in the central portion and a polycrystalline SiGe region is formed at both sides thereof, or such that the Ge composition ratio is higher in the regions that are closer to the side of the gate electrode 12. These example configurations also promote high-speed operation in semiconductor devices, provided that the materials for the lower gate electrode element 12a and the upper gate electrode element 12b are selected such that the oxidation rate at both side portions of the lower gate electrode element 12a is higher than that at the upper gate electrode element 12b.

Although pyrogenic oxidation is employed to oxidize the gate electrode 12 in the present embodiment, the method of oxidation is not limited to the above, and, may be, for example, dry oxidation, wet oxidation, or steam oxidation. Oxidation methods that are performed under an atmosphere containing water vapor, such as pyrogenic oxidation and steam oxidation, have an advantage in that they can expedite the progress of oxidation.

Although polycrystalline SiGe or polycrystalline SiGeC is used to form the lower gate electrode element 12a in the present embodiment, amorphous SiGe or amorphous SiGeC may alternatively be used.

When the lower gate electrode element 12a is composed of SiGe, it is preferable that the composition of Ge, i.e., the value of x in the expression of $Si_{1-x}Ge_x$, be not less than 0.05 and not more than 0.90, more preferably not less than 0.1 and not more than 0.7, and even more preferably not less than 0.2 and not more than 0.6.

(Second Embodiment)

Figure 5:
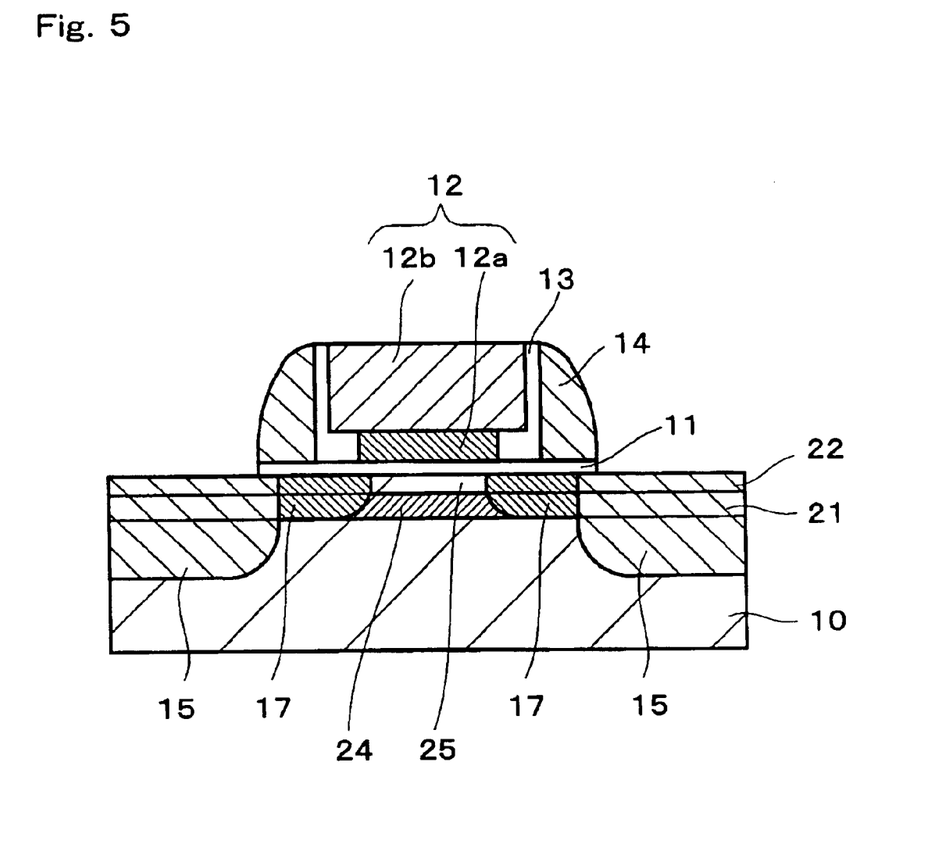
FIG. 5 is a cross-sectional view of a semiconductor device according to the second embodiment of the present invention.

The second embodiment of the present invention will now be described. FIG. 5 is a cross-sectional view of a semiconductor device according to the present embodiment.

The semiconductor device of the present embodiment is identical to that of the first embodiment in terms of the structure of the gate electrode, but is different in terms of the structure of the substrate on which the gate electrode is formed. The equivalent structural elements are therefore provided with the same reference numerals. Also, the detailed explanations for the equivalent elements are omitted.

As illustrated in FIG. 5, in the semiconductor device of the present embodiment, the substrate on which the gate electrode is formed has a structure in which an SiGe film 21 with a thickness of about 15 nm is formed by epitaxial growth on an Si substrate 10, and an Si film 22 with a thickness of about 5 nm is formed thereon by epitaxial growth. A gate electrode 12 is formed on the Si film 22 via a gate insulating film 11.

The SiGe film 21, which is located under a lower gate electrode element 12a, forms an SiGe channel region 24, while the Si film 22 forms an Si cap layer 25. In addition, p-type source/drain extension regions 17 and source/drain regions 15 are formed in the SiGe film 21 and the Si film 22 at the side of the lower gate electrode element 12a, as well as in part of the Si substrate 10.

The gate electrode 12 is identical to that of the first embodiment, as described above, and thus is constituted by the lower gate electrode element 12a, which is composed of polycrystalline SiGe, and an upper gate electrode element 12b, which is composed of polycrystalline Si. Further, the length of the lower gate electrode element 12a in the gate length direction is made shorter than the length of the upper gate electrode element 12b in the gate length direction by means of oxidation, thereby preventing an increase in gate overlap capacitance.

The following problems arise when a gate electrode has a lower gate electrode element composed of polycrystalline SiGe. The problems will be described with reference to FIGS. 6 and 7.

FIGS. 6(a), (b) and (c) are energy band diagrams showing the band structure for n-type and p-type polycrystalline Si gates, n-type and p-type polycrystalline SiGe gates, and n-type and p-type polycrystalline SiGeC gates, respectively. FIGS. 7(a) and (b) are diagrams showing the built-in potential of a p-channel MIS transistor having a polycrystalline Si gate and an Si channel region, and of a p-channel MIS transistor having a polycrystalline SiGe gate and an Si channel region, respectively.

Figure 6:
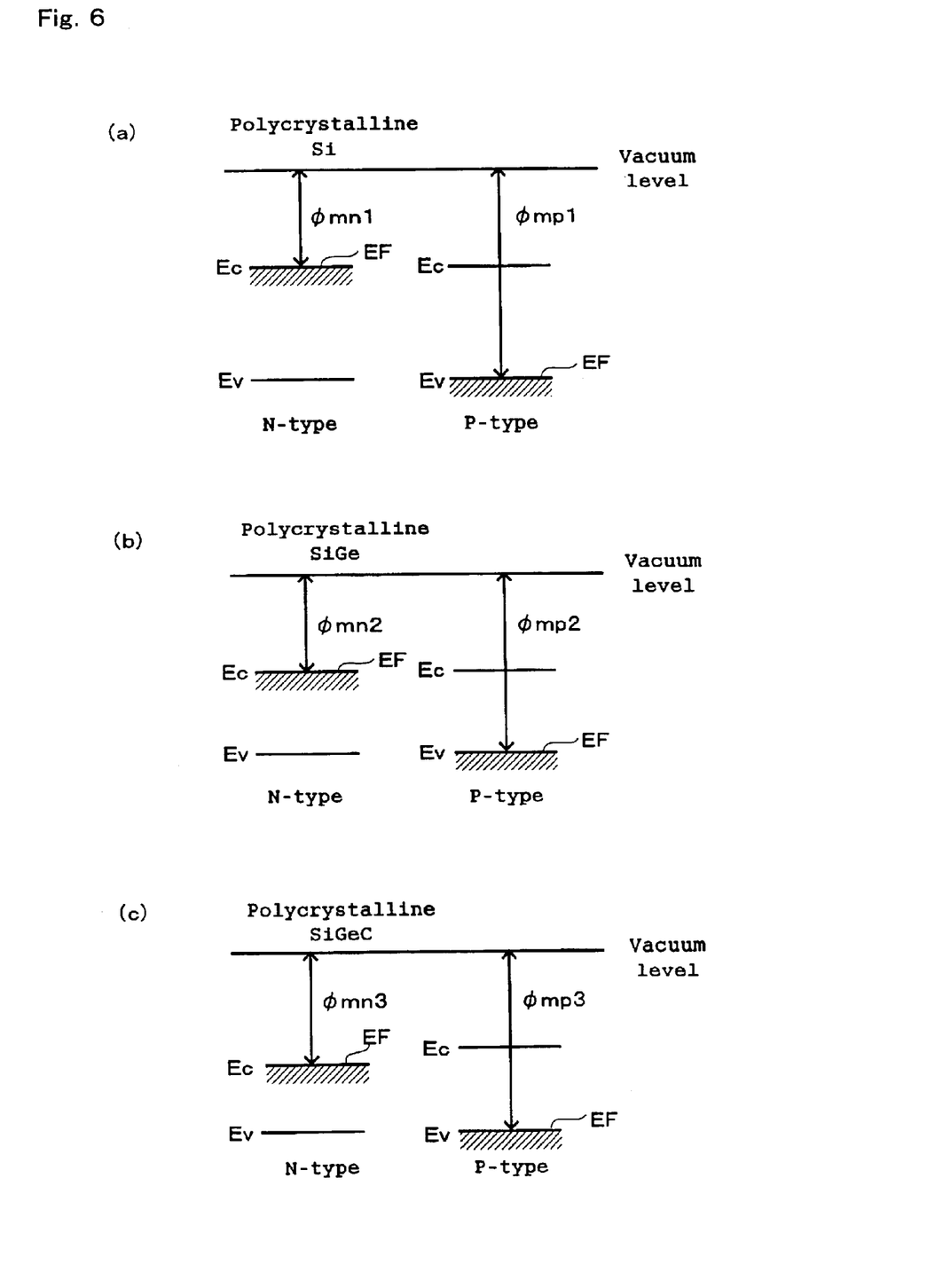
Figure 7:
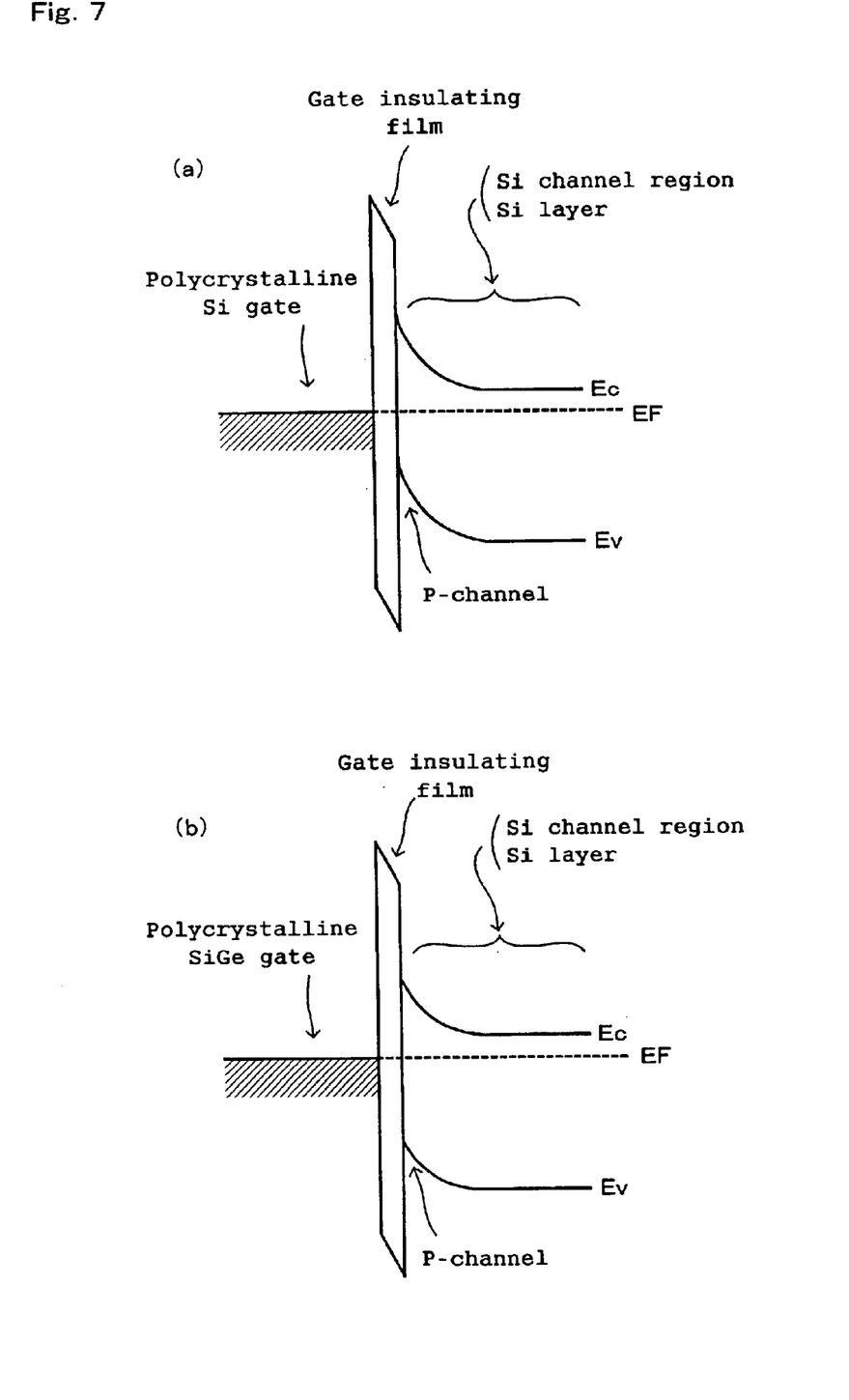

For example, in the case where a dual-gate structure is employed, the gate electrode of an n-channel MIS transistor (hereinafter referred to as an "nMIS transistor") is doped with an n-type impurity, and that of a p-channel MIS transistor (hereinafter referred to as a "pMIS transistor") is doped with a p-type impurity. In this case, as indicated in FIG. 6, the Fermi level EF in the gate electrode of the nMIS transistor is identical to the energy level Ec of the conduction band edge, while the Fermi level EF in the gate electrode of the pMIS transistor is identical to the energy level Ev of the valence band edge.

As can be seen from the comparison between FIGS. 6(a) and (b), in the case of nMIS transistors, the work function Fmn2 (i.e., the difference between the vacuum level and the Fermi level EF) of the polycrystalline SiGe gate is almost the same as the work function Fmn1 (i.e., the difference between the vacuum level and the Fermi level EF) of the polycrystalline Si gate. However, in the case of pMIS transistors, the work function Fmp2 (i.e., the difference between the vacuum level and the Fermi level EF) of the polycrystalline SiGe gate is considerably lower than the work function Fmp1 (i.e., the difference between the vacuum level and the Fermi level EF) of the polycrystalline Si gate, with the result that the following disadvantages are caused.

When the MIS transistors shown in FIGS. 7(a) and (b) are operated, a p-channel is formed in the Si channel region in the area adjacent to the gate insulating film. As can be seen from a comparison of FIGS. 7(a) and (b), the band bending from the built-in potential of the pMIS transistor having the polycrystalline SiGe gate (FIG. 7(b)) is gentler, resulting in a tendency toward a higher threshold voltage than that of the pMIS transistor having the polycrystalline Si gate.

Figure 8:
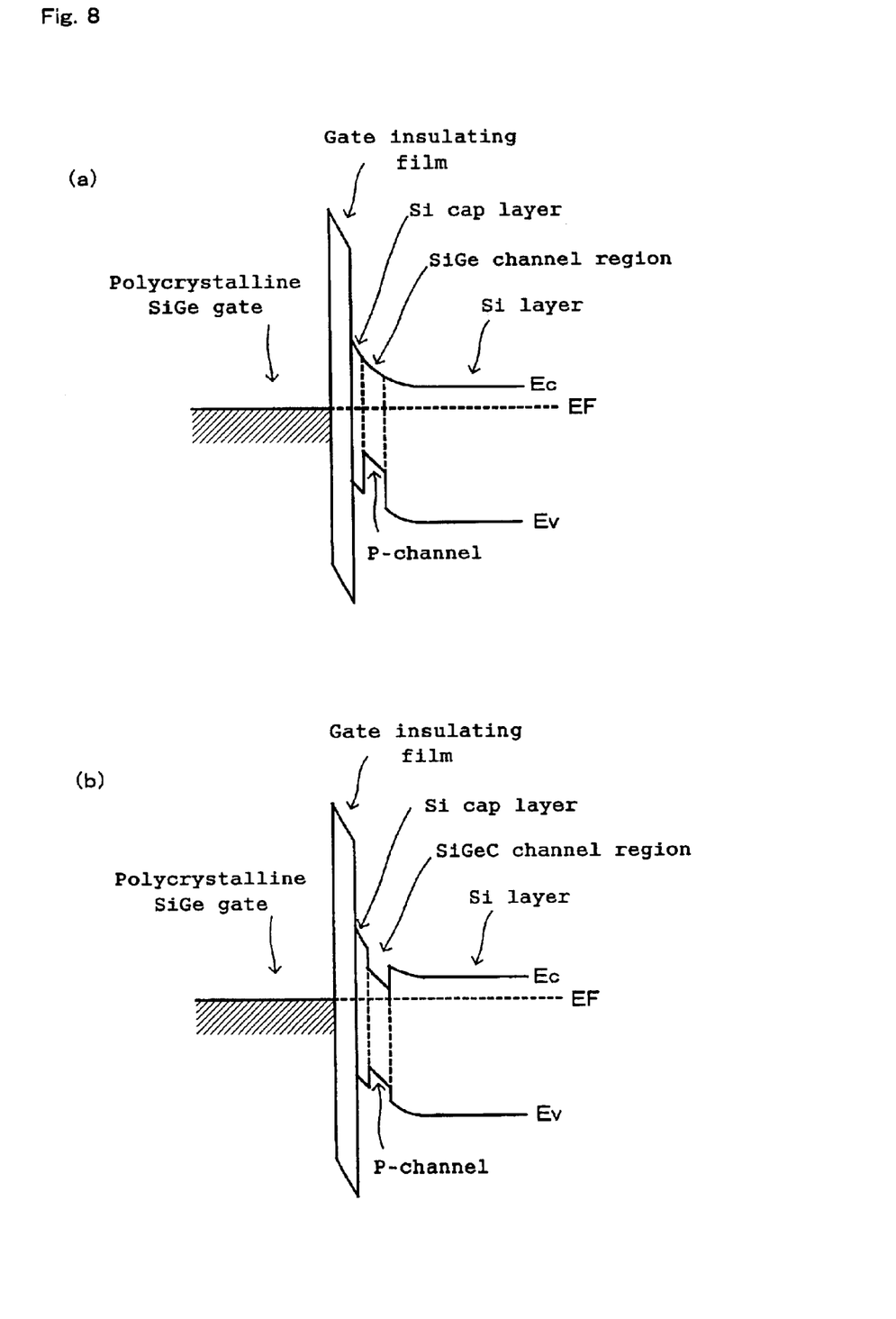

In contrast, the semiconductor device of the present embodiment includes the SiGe channel region 24, as mentioned above, and thus can suppress an increase in threshold voltage. This will be described below with reference to FIG. 8.

FIGS. 8(a) and (b) are diagrams showing the built-in potential of a pMIS transistor having a polycrystalline SiGe gate and an SiGe channel region, and of a pMIS transistor having a polycrystalline SiGe gate and an SiGeC channel region, respectively.

In the semiconductor device of the present embodiment, a band offset occurs in the valence band edge at the Si/SiGe heterojunction because the lower gate electrode element 12a is an SiGe gate with the Si cap layer 25 and SiGe channel region 24, as shown in FIG. 8(a). As a result, the pMIS transistor of the present embodiment, when operated, allows the holes to transit through the p-channel formed in the valence band edge of the SiGe channel region 24, and thus has the advantage of suppressing an increase in threshold voltage over the pMIS transistor of FIG. 7(a), which has an Si gate and an Si channel.

As described above, the present embodiment includes the channel region 24 formed by SiGe in addition to the constituents of the first embodiment. Accordingly, the present embodiment provides not only the effect of the first embodiment, but also the effect of suppressing an increase in threshold voltage.

Although the channel region is formed by SiGe in the above arrangement, it may alternatively be formed by SiGeC. In this alternative case, a band offset occurs in the valence band edge at the Si/SiGeC heterojunction, as shown in FIG. 8(b), so that a p-channel is formed in the valence band edge of the SiGeC region, thereby also suppressing an increase in threshold voltage.

Figure 9:
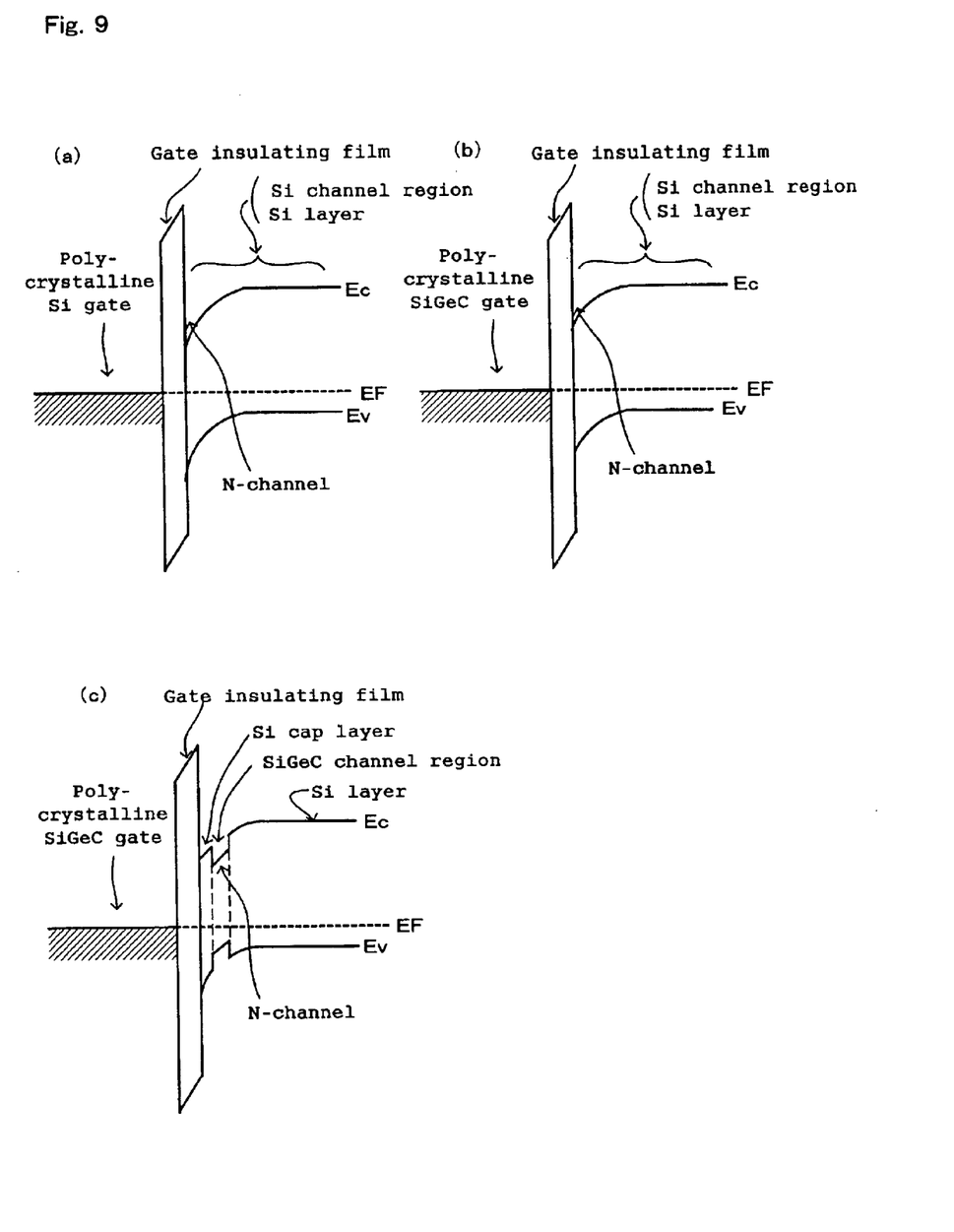
FIGS. 9(a) to (c) are diagrams showing the built-in potential of an nMISFET having a polycrystalline Si gate and an Si channel region, of an nMISFET having a polycrystalline SiGeC gate and an Si channel region, and of an nMISFET having a polycrystalline SiGeC gate and an SiGeC channel region, respectively.

As can be seen from FIG. 6(c), in the case of nMIS transistors, the work function Fmn3 of the polycrystalline SiGeC gate is higher than the work function Fmn1 of the polycrystalline Si gate. On the other hand, in the case of pMIS transistors, the work function Fmp3 of the polycrystalline SiGeC gate is lower than the work function Fmp1 of the polycrystalline Si gate. It is, therefore, likely that the same disadvantage as that of FIG. 7(b) is caused in both nMIS and pMIS transistors having an SiGeC gate and Si channel region. As regards pMIS transistors, an increase in threshold voltage can be suppressed by providing a polycrystalline SiGeC gate as well as a polycrystalline SiGe channel region or polycrystalline SiGeC channel region, as can be deduced from FIGS. 8(a) and (b). As regards nMIS transistors, the explanation is found in FIG. 9.

FIGS. 9(a) to (c) are diagrams showing the built-in potential of an nMIS transistor having a polycrystalline Si gate and an Si channel region, of an nMIS transistor having a polycrystalline SiGeC gate and an Si channel region, and of an nMIS transistor having a polycrystalline SiGeC gate and an SiGeC channel region, respectively.

In each of the nMIS transistors shown in FIGS. 9(a) and (b), an n-channel is formed in the Si channel region in the area adjacent to the gate insulating film. As is evident by comparison of FIGS. 9(a) and (b), the band bending from the built-in potential of the nMIS transistor having the polycrystalline SiGeC gate (FIG. 9(b)) is gentler, resulting in a tendency toward a higher threshold voltage than that of the nMIS transistor having the polycrystalline Si gate.

When an nMIS transistor having a polycrystalline SiGeC gate is provided with an SiGeC channel region, as shown in FIG. 9(c), a band offset occurs in the conduction band edge at the Si/SiGeC heterojunction. Such a transistor, when operated, allows the electrons to transit through the n-channel formed in the conduction band edge of the SiGeC channel region, and thus has the advantage of suppressing an increase in threshold voltage over the nMIS transistor having an Si gate and Si channel region (FIG. 9(a)).

(Third Embodiment)

Figure 10:
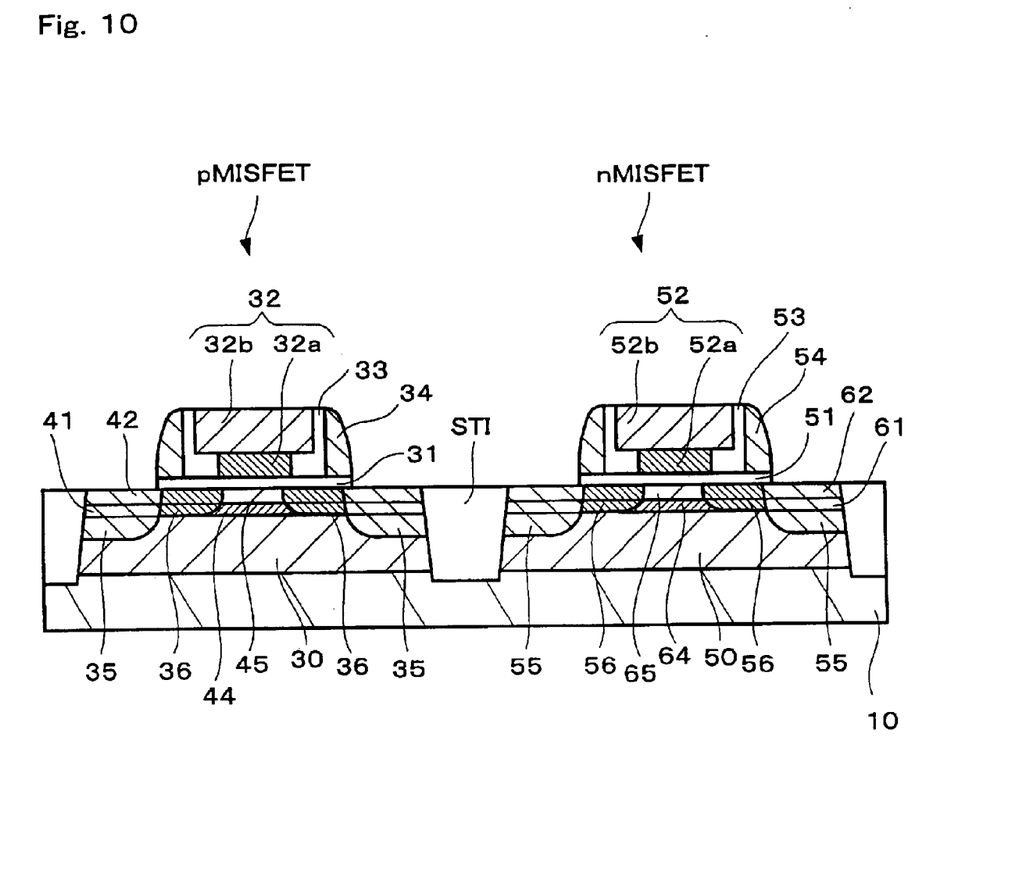
FIG. 10 is a diagram illustrating a semiconductor device according to the third embodiment of the present invention.

The third embodiment of the present invention will now be described. FIG. 10 is a cross-sectional view of a semiconductor device according to the third embodiment of the present invention.

As illustrated in FIG. 10, the semiconductor device of the present embodiment is a CMIS device with a dual-gate structure, and comprises a shallow trench isolation (STI) region, and an n-well 30 and a p-well 50 formed in the two regions separated from each other by the STI region. A p-channel MIS transistor (pMISFET) is provided above the n-well 30, while an n-channel MIS transistor (nMISFET) is provided above the p-well 50.

The pMISFET comprises a gate insulating film 31 formed on the n-well 30 and a gate electrode 32 formed thereon. The gate insulating film 31 is composed of silicon oxide and has a thickness of about 2 nm. The gate electrode 32 is composed of a lower gate electrode element 32a formed on the gate insulating film 31 and an upper gate electrode element 32b formed thereon. The lower gate electrode element 32a includes a p-type impurity (e.g., boron) in high concentration, and is composed of polycrystalline SiGe (with a Ge composition ratio of about 30%) with a thickness of about 50 nm. The upper gate electrode element 32b includes a p-type impurity (e.g., boron) in high concentration, and is composed of polycrystalline Si with a thickness of about 150 nm.

Oxide film sidewalls 33 are formed on the side faces of the gate electrode 32, i.e., on the side faces of the upper gate electrode element 32b and the lower gate electrode element 32a. Nitride film sidewalls 34 are also formed on the side faces of the oxide film sidewalls 33. Further, high-impurity-concentration p-type source/drain regions 35 are formed in the n-well 30 at the sides of the nitride film sidewalls 34. Source/drain extension regions 36 are also formed in the n-well 30 in such a manner as to extend from the inner edges of the source/drain regions 35 toward the area under the lower gate electrode element 32a and to sandwich a channel region, which will be described later.

In the pMISFET of the present embodiment, as illustrated in FIG. 10, the oxide film sidewalls 33 are formed by means of thermal oxidation, as with the case of the first embodiment. Therefore, the length of the lower gate electrode element 32a in the gate length direction is made shorter than the length of the upper gate electrode element 32b in the gate length direction, thereby reducing the area of the gate overlap region.

The substrate on which the gate electrode 32 is formed is structured in the same manner as that of the second embodiment. More specifically, an SiGe film 41 with a thickness of about 15 nm is formed by epitaxial growth on the upper face of the n-well 30, and an Si film 42 with a thickness of about 5 nm is formed by epitaxial growth on the SiGe film 41. The gate electrode 32 is formed on the Si film 42 via the gate insulating film 31.

The SiGe film 41, which is located below the lower gate electrode element 32a, forms an SiGe channel region 44, while the Si film 42 forms an Si cap layer 45. Further, the above source/drain extension regions 36 and the source/drain regions 35 are formed in the SiGe film 41 and the Si film 42 at the side of the lower gate electrode element 12a, as well as in part of the n-well 10.

As illustrated in FIG. 10, the nMISFET is configured in essentially the same manner as the pMISFET except that it is formed on the p-well 50 and its conductivity is n-type. In other words, the configuration of a gate electrode 52 is identical to that of the gate electrode of the pMISFET except that a lower gate electrode element 52a is composed of polycrystalline SiGe (with a Ge composition ratio of about 30%) containing an n-type impurity in high concentration and that an upper gate electrode element 52b is composed of polycrystalline Si containing an n-type impurity in high concentration. As with the case of the pMISFET, the length of the lower gate electrode element 52a in the gate length direction is made shorter than the length of the upper gate electrode element 52b in the gate length direction by means of oxidation. Source/drain regions 55 and source/drain extension regions 56 are n-type. Further, an Si layer 65 and an SiGe layer 64 are provided below the lower gate electrode element 52a, as with the case of the pMISFET.

The above dual-gate CMIS device, which comprises the SiGe channel regions 44 and 64, provides the following effects.

In the pMISFET, the gate overlap region is small because the length of the lower gate electrode element in the gate length direction is shorter than the length of the upper gate electrode element in the gate length direction. Further, since a band offset occurs in the valence band edge at the Si/SiGe heterojunction, the holes transit through the p-channel formed in the valence band edge of the SiGe channel region 44. Consequently, a higher operating speed can be achieved and an increase in the threshold voltage can be suppressed by reducing the area of the gate overlap region.

On the other hand, in the nMISFET, virtually no band offset occurs in the conduction band edge at the Si/SiGe heterojunction. Hence, when the nMISFET is operated, an n-channel is formed in the Si cap layer 55 in a region adjacent to a gate insulating film 51, thus allowing the electrons to transit through the n-channel. This nMISFET, therefore, performs the same operation as an nMISFET that has no SiGe channel region.

A conventional dual-gate CMIS device having polycrystalline Si gates may be designed such that an nMISFET and pMISFET have essentially the same threshold voltage. However, for a dual-gate CMIS device having polycrystalline SiGe gates, such as the one described above, it is presumably difficult to assign essentially the same threshold voltage to an nMISFET and pMISFET because it would interfere with the balance between the nMISFET and pMISFET in terms of the work function of the polycrystalline SiGe gate.

However, according to the nMISFET of the present embodiment, a threshold voltage as low as that of the nMISFET having a polycrystalline Si gate may be maintained, because the work function Fmn2 of the polycrystalline SiGe gate is almost the same as the work function Fmn1 of the polycrystalline Si gate (ref. FIG. 6). Furthermore, according to the pMISFET of the present embodiment, although the work function Fmp2 of the polycrystalline SiGe gate differs from the work function Fmp1 of the polycrystalline Si gate (ref. FIG. 6), a low threshold voltage may be maintained as well because the holes transit through the p-channel formed in the SiGe channel region during the operation of the transistor.

As understood from the above, according to the dual-gate CMIS device of the present embodiment, the electrons transit through the n-channel formed in the surface region of the Si cap layer 65 during the operation of the nMISFET, whereas, during the operation of the pMISFET, the holes transit through the p-channel formed in the SiGe channel region 44, which has a small band gap. As a result, both the pMISFET and nMISFET can maintain a low threshold voltage, thus keeping them in balance.

Furthermore, in the pMISFET of the CMIS device according to the present embodiment, the p-channel is formed in the SiGe channel region, which exhibits high hole mobility, thus enhancing the current drive capability. In addition, in the case where an inverter is constructed by using this CMIS device, a reduction in the area of the SiGe channel region of the pMISFET can be achieved, leading to a reduction in capacitance. The semiconductor device of the present invention, therefore, enables a higher operating speed by reducing the area of the overlap region, as well as increasing the device integration.

INDUSTRIAL APPLICABILITY

The present invention provides a semiconductor device and a process for manufacturing the same in which a gate electrode of a notched-gate structure is formed by an extremely simple manufacturing process. This semiconductor device achieves high-speed operation by reducing gate overlap capacitance.

What is claimed is:

1. A process for manufacturing a semiconductor device, comprising the steps of:

forming a lower gate electrode film on a semiconductor substrate via a gate insulating film;

forming an upper gate electrode film on the lower gate electrode film, the upper gate electrode film being made of a material having a lower oxidation rate than that of the lower gate electrode film;

forming a gate electrode by patterning the upper gate electrode film and the lower gate electrode film, the gate electrode comprising a lower gate electrode element and an upper gate electrode element;

forming source and drain regions by introducing an impurity into the semiconductor substrate; and forming oxide film sidewalls by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode film is formed of a Group IV semiconductor, wherein the lower gate electrode film contains SiGe, and wherein the upper gate electrode film is formed of a Group IV semiconductor containing SiGe, and wherein the upper gate electrode film has a lower Ge composition ratio than that of the lower gate electrode film.

2. A process for manufacturing a semiconductor device, comprising the steps of:

forming a lower gate electrode film on a semiconductor substrate via a gate insulating film;

forming an upper gate electrode film on the lower gate electrode film, the upper gate electrode film being made of a material having a lower oxidation rate than that of the lower gate electrode film;

forming a gate electrode by patterning the upper gate electrode film and the lower gate electrode film, the gate electrode comprising a lower gate electrode element and an upper gate electrode element;

forming source and drain regions by introducing an impurity into the semiconductor substrate; and forming oxide film sidewalls by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode film is formed of a Group IV semiconductor, wherein the lower gate electrode film contains SiGe, and wherein the step of forming the oxide film sidewalls is performed by oxidizing the lower gate electrode element to thereby form a region in both side portions of the lower gate electrode element in the gate length direction, the regions having a higher Ge composition ratio than that of the central portion of the lower gate electrode element.

3. A process for manufacturing the semiconductor device according to claim 1, wherein the step of forming the oxide film sidewalls is performed under an atmosphere containing water vapor.

4. A process for manufacturing a semiconductor device comprising the steps of:

forming a lower gate electrode film on a semiconductor substrate via a gate insulating film;

forming an upper gate electrode film on the lower gate electrode film, the upper gate electrode film being made of a material having a lower oxidation rate than that of the lower gate electrode film;

forming a gate electrode by patterning the upper gate electrode film and the lower gate electrode film, the gate electrode comprising a lower gate electrode element and an upper gate electrode element;

forming source and drain regions by introducing an impurity into the semiconductor substrate; and forming oxide film sidewalls by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode film is formed of a Group IV semiconductor, wherein the lower gate electrode film contains SiGe, and wherein the semiconductor substrate includes a channel region containing SiGe or SiGeC between the source and drain regions.

5. A process for manufacturing a semiconductor device, comprising the steps of:

forming a lower gate electrode film on a semiconductor substrate via a gate insulating film;

forming an upper gate electrode film on the lower gate electrode film, the upper gate electrode film being made of a material having a lower oxidation rate than that of the lower gate electrode film;

forming a gate electrode by patterning the upper gate electrode film and the lower gate electrode film, the gate electrode comprising a lower gate electrode element and an upper gate electrode element;

forming source and drain regions by introducing an impurity into the semiconductor substrate; and forming oxide film sidewalls by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode film is formed of a Group IV semiconductor, wherein the lower gate electrode film contains SiGe, and wherein the step of forming the lower gate electrode element is performed by forming a first region and second regions, the second regions sandwiching the first region therebetween in the gate length direction and having a higher Ge composition ratio than that of the first region, and wherein the step of forming the gate electrode is performed by patterning the lower gate electrode film and the upper gate electrode film such that the second regions are located in both side portions of the lower gate electrode element in the gate length direction.

6. A semiconductor device comprising:

a semiconductor substrate;

a lower gate electrode element formed on the semiconductor substrate via a gate insulating film;

an upper gate electrode element formed on the lower gate electrode element and made of a material having a lower oxidation rate than that of the lower gate electrode element;

source and drain regions formed in the semiconductor substrate below the lower gate electrode element in such a manner as to sandwich a channel region; and oxide film sidewalls formed by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode element is formed of a Group IV semiconductor, wherein the lower gate electrode element contains SiGe, and wherein the lower gate electrode element includes regions in both side portions thereof in the gate length direction, the regions having a higher Ge composition ratio than that of the central portion of the lower gate electrode element.

7. A semiconductor device comprising:

a semiconductor substrate;

a lower gate electrode element formed on the semiconductor substrate via a gate insulating film;

an upper gate electrode element formed on the lower gate electrode element and made of a material having a lower oxidation rate than that of the lower gate electrode element;

source and drain regions formed in the semiconductor substrate below the lower gate electrode element in such a manner as to sandwich a channel region; and oxide film sidewalls formed by oxidizing the side faces of the lower gate electrode element and the upper gate electrode element, the thickness of the oxide film sidewalls in the gate length direction being larger at the sides of the lower gate electrode element than at the sides of the upper gate electrode element, wherein the lower gate electrode element is formed of a Group IV semiconductor, wherein the lower gate electrode element contains SiGe, and wherein the semiconductor substrate includes the channel region containing SiGe or SiGeC between the source and drain regions.

* * * * *